United States Patent [19]

White

[11] Patent Number: 5,587,119
[45] Date of Patent: Dec. 24, 1996

[54] METHOD FOR MANUFACTURING A COAXIAL INTERCONNECT

[75] Inventor: David M. White, Sulpher Springs, Tex.

[73] Assignee: E-Systems, Inc., Dallas, Tex.

[21] Appl. No.: 452,104

[22] Filed: May 26, 1995

Related U.S. Application Data

[62] Division of Ser. No. 305,290, Sep. 14, 1994, abandoned.

[51] Int. Cl.[6] ................................................. C04B 35/00
[52] U.S. Cl. ........................................ 264/104; 264/265
[58] Field of Search ................................. 264/104, 259, 264/265; 427/97

[56] References Cited

U.S. PATENT DOCUMENTS 4,911,771  3/1990  Tanaka et al. ........................ 264/104
5,518,674  5/1996  Powell et al. ........................ 264/104

*Primary Examiner*—George Yeung
*Attorney, Agent, or Firm*—Harold E. Meier

[57] ABSTRACT

A multi-chip-module comprising a plurality of vertically layered substrates and including a plurality of coaxial inter-connects formed between and through the substrate layers. Each of the coaxial inter-connects is formed by a process wherein: an outer hole (aperture) is drilled through the substrate and lined with an electrically conductive material to form an outer via; the outer via is filled with a dielectric material; and, an inner hole (aperture) is drilled through the dielectric material and filled with an electrically conductive material to form a center via. The characteristic impedance of the coaxial inter-connect is determined by the selection of the outer diameters of the drilled holes for the outer and center vias.

4 Claims, 1 Drawing Sheet

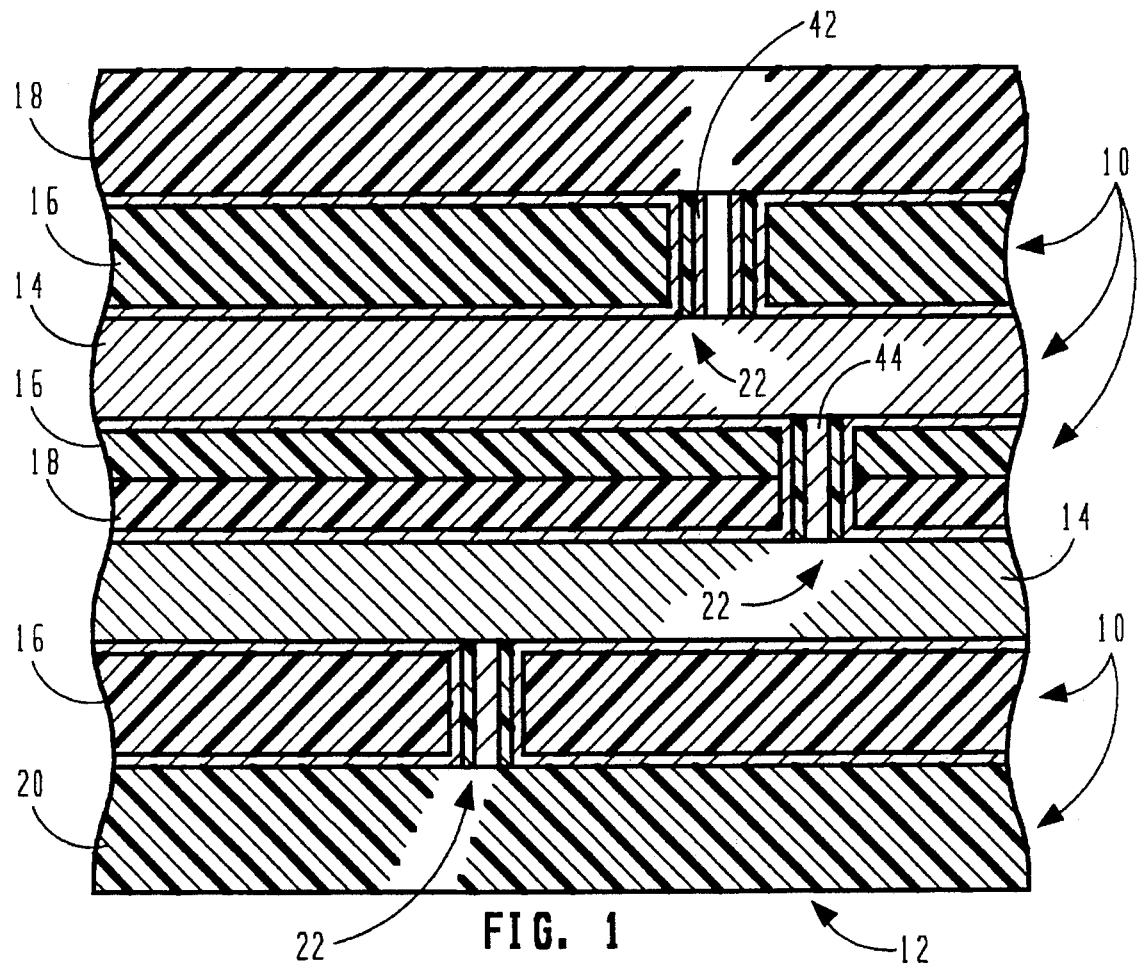
FIG. 1
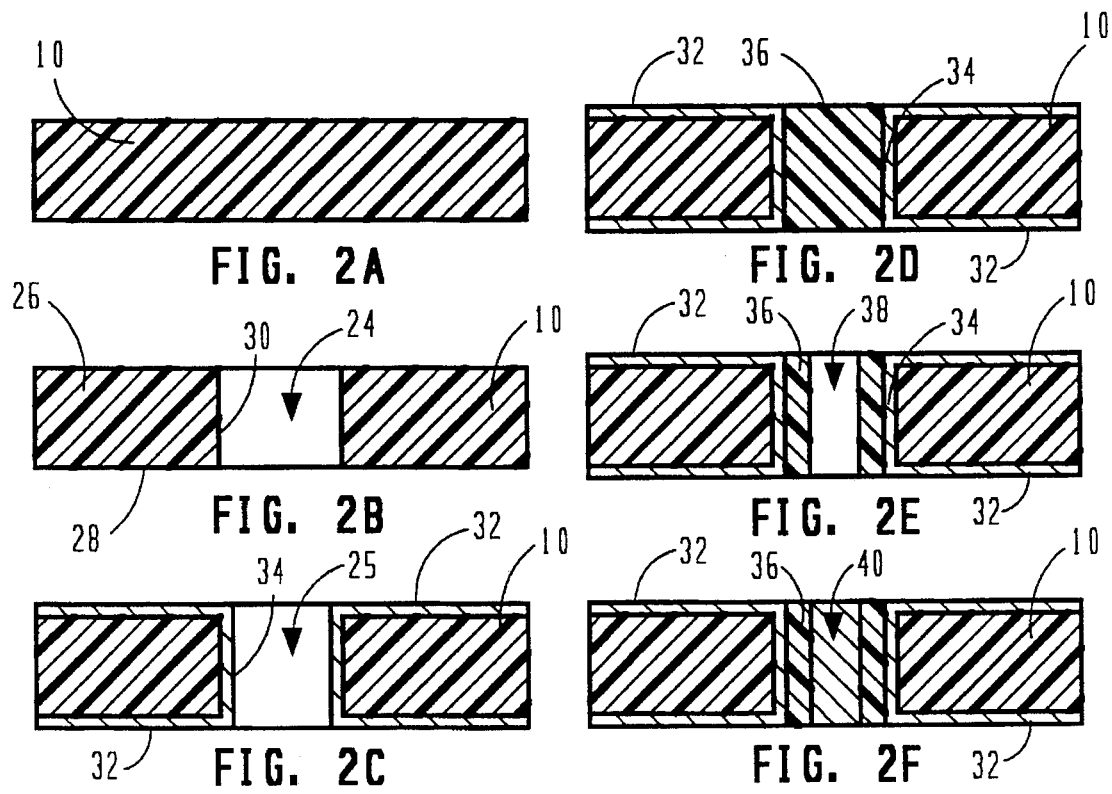
FIG. 2A
FIG. 2B
FIG. 2C
FIG. 2D
FIG. 2E
FIG. 2F

METHOD FOR MANUFACTURING A COAXIAL INTERCONNECT

This is a division of application Ser. No. 08/305,290 filed on Sep. 14, 1994.

TECHNICAL FIELD

The present invention relates to a multi-chip-module and, in particular, to a controlled impedance inter-connection for use in connecting between and through vertically stacked multi-chip-module substrates.

BACKGROUND OF THE INVENTION

It is well known to use socket-type inter-connections between and through the substrates of three-dimensional multi-chip-modules. However, currently available socket-type inter-connections suffer from several drawbacks. Notably, these connections fail to provide a controlled impedance signal path resulting in a limitation in performance speed (bandwidth). In addition, the socket inter-connection is not shielded, and is therefore susceptible to cross-talk and signal loss. Furthermore, the inter-connection often includes one or more points of discontinuity leading to a reduction in signal integrity. Accordingly, there is a need for an improved shielded and continuous inter-connection having a controlled impedance for connecting between and through vertically stacked multi-chip-module substrates.

SUMMARY OF THE INVENTION

The present invention comprises a controlled impedance coaxial inter-connect formed between and through substrates in a multi-chip-module. The coaxial inter-connect extends through an opening in a substrate and includes an outer cylindrical conductive via, a center conductive via, and a dielectric material positioned between the outer and center vias.

The coaxial inter-connect is manufactured in accordance with the following process. First, an outer hole is drilled through the substrate. Next, the outer hole is lined with an electrically conductive material to form the outer via. Then, the outer via is filled with a dielectric material. Next, an inner hole is drilled through the dielectric material. Finally, the inner hole is filled with an electrically conductive material to form a center via.

BRIEF DESCRIPTION OF THE DRAWINGS

A more complete understanding of the present invention may be had by reference to the following Detailed Description when taken in conjunction with the accompanying Drawings wherein:

FIG. 1 is a cross-sectional view of a three-dimensional multi-chip-module incorporating several coaxial inter-connects of the present invention; and FIGS. 2A–2F are cross-sectional views illustrating the steps of the method of manufacturing the multi-chip-module coaxial inter-connect of the present invention.

DETAILED DESCRIPTION OF THE DRAWINGS

Reference is now made to FIG. 1 wherein there are shown a plurality of vertically stacked substrates 10 comprising a multi-chip-module 12. The substrates 10 comprise, among other types of substrate layers known for use in a multi-chip-module 12, a planar inter-connect layer 14, a planar thermal heatsink layer 16, and a planar dielectric separation layer 18. The vertically layered substrates 10 rest on a supporting substrate 20. The multi-chip-module 12 further includes a number of coaxial inter-connects 22 formed between and through the various substrates 10 (as shown) for electrically inter-connecting other substrate layers and the various circuit components (such as dies, not shown) included in the multi-chip-module.

Reference is now made to cross-sectional FIGS. 2A–2F in connection with a description of the method of manufacturing the coaxial inter-connects 22 for the multi-chip-module 12 of FIG. 1. The thicknesses of the various layers illustrated in FIGS. 2A–2F have been exaggerated for clarity.

FIG. 2A shows a portion of a layer of substrate 10 in a multi-chip-module. The first step in the process for manufacturing the coaxial inter-connect of the present invention is to drill an outer hole (aperture) 24 through the substrate 10 as shown in FIG. 2B. It will, of course, be understood that the outer hole for the coaxial inter-connect may extend through multiple stacked substrates if desired. Next, the upper surface 26 and the lower surface 28 of the substrate 10, along with the inside surface 30 of the hole 24, are chemically plated with an electrically conductive material to form, as shown in FIG. 2C, conductive surfaces 32 and a shielding outer conductive via 34. Plating in this manner provides for a continuous electrical connection through the substrate 10. The plated outer hole 25 of the via 34 is then filled with a low dielectric constant material 36 (for example, TEFLON or cyanate ester) as shown in FIG. 2D. Next, as shown in FIG. 2E, an inner hole (aperture) 38 is drilled through the filled dielectric material 36. Manufacture of the coaxial inter-connect 22 is then completed in FIG. 2F by filling the inner hole 38 with a compliant electrically conductive material to form a center conductive via 40. The filling of the inner hole 38 may alternatively be accomplished by either chemically plating the inside surface of the inner hole with a conductor 42 (FIG. 1), or by inserting a conductive "fuzz-button" 44 (FIG. 1) through the hole. A fuzz-button 44 is a metallic mesh woven into a cylindrical shape of a predetermined diameter and length. Fuzz buttons may be obtained from various manufacturers of electrical components including Cinch Connector, a division of Labinal Components and Systems, Inc.

The characteristic impedance ($Z_o$) of the coaxial inter-connect 22 is dependant upon the intrinsic impedance (n) of the medium, the outer diameter ($b_1$) of the outer hole 24 for the outer conductive via 34 and the outer diameter ($a_2$) of the inner hole 38 for the center conductive via 40, and can be approximated by the following equation:

$$Z_o = (\eta/2\pi)ln(b/a).$$

Through proper selection of the outer diameters of the outer and center conductive vias 34 and 40, respectively, a desired characteristic impedance may be formed for the coaxial inter-connect 22.

Although only one embodiment of the present invention has been described in the foregoing Detailed Description and illustrated in the accompanying Drawings, it will be understood that the present invention is susceptible to numerous changes and modifications as known to one skilled in the art without departing from the scope of the invention as claimed.

I claim:

1. A method for manufacturing a coaxial interconnect, comprising the steps of:

forming an outer aperture through a substrate layer;

coating an inner surface of the outer aperture in the substrate layer with an electrically conductive material to form an outer conductor of the coaxial inter-connect;

filling the coated outer aperture with a dielectric material;

forming an inner aperture through the dielectric material; and filling the inner aperture in the dielectric material with an electrically conductive material to form a center conductor of the coaxial inter-connect.

2. The method as in claim 1 wherein the outer aperture in the substrate layer has a first outer diameter and the inner aperture in the dielectric material has a second outer diameter, further including the step of: selecting the first and second outer diameters to establish a predetermined characteristic impedance for the coaxial inter-connect.

3. The method as in claim 1 wherein the step of filling the inner aperture in the dielectric material comprises the step of inserting a fuzz-button through the inner aperture to form the center conductor of the coaxial inter-connect.

4. The method as in claim 1 wherein the step of filling the inner aperture in the dielectric material comprises the step of coating an inner surface of the inner aperture with an electrically conductive material.

* * * * *